United States Patent [19]

Petruzella

[11] 3,806,771

[45] Apr. 23, 1974

[54] SMOOTHLY BEVELED SEMICONDUCTOR DEVICE WITH THICK GLASS PASSIVANT

[75] Inventor: James Petruzella, Auburn, N.Y.

[73] Assignee: General Electric Company, Syracuse, N.Y.

[22] Filed: Jan. 15, 1971

[21] Appl. No.: 215,372

Related U.S. Application Data

[63] Continuation of Ser. No. 821,687, May 5, 1969, abandoned.

[52] U.S. Cl. 317/235 F, 317/235 AB, 317/235 AG, 317/234 F, 317/235 R

[51] Int. Cl. .......... H01l 11/00

[58] Field of Search .... 317/235 AJ, 235 AB, 235 F, 317/234 F, 235 AG

[56] References Cited

UNITED STATES PATENTS

| | | | |
|---|---|---|---|
| 3,492,174 | 1/1970 | Nakamura | 148/175 |
| 3,493,820 | 2/1970 | Rosvold | 317/234 |
| 3,535,133 | 10/1970 | Saleem Akhtar | 106/33 |
| 3,368,024 | 2/1968 | Bishop | 174/52 |
| 3,460,003 | 8/1969 | Hampikian | 317/234 |
| 3,697,829 | 10/1972 | Huth | 317/235 R |

*Primary Examiner*—Martin H. Edlow
*Attorney, Agent, or Firm*—Robert J. Mooney

[57] ABSTRACT

A silicon crystal having a major surface in the 100 crystallographic plane is etched with an alcoholic solution of potassium hydroxide to produce a smoothly tapered groove intersecting a junction at a positive bevel angle of about 55 degrees. To passivate the junction and to structurally reinforce the crystal a thick glass bonding layer is applied to the groove having a thermal coefficient of expansion no greater than that of silicon.

3 Claims, 4 Drawing Figures

Figure 1:
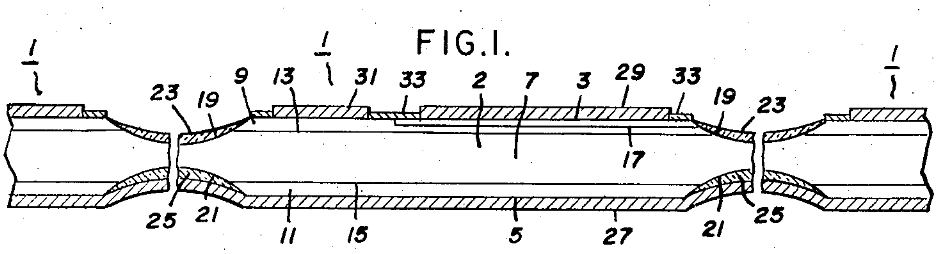

INVENTOR:
JAMES E. PETRUZELLA,
BY Carl O. Thomas
HIS ATTORNEY.

SMOOTHLY BEVELED SEMICONDUCTOR DEVICE WITH THICK GLASS PASSIVANT

This application is a continuation of my application Ser. No. 821,687, filed May 5, 1969, titled Smoothly Beveled Semiconductor Device With Thick Glass Passivant, and now abandoned.

My invention is directed to a semiconductor device having a semiconductive crystal associated with a junction passivant in a manner to improve the electrical properties of the semiconductor device and the mechanical properties of the passivated semiconductive crystal.

It is by now well understood how to manufacture semiconductor devices capable of blocking extremely high voltage differentials across their terminals. Unfortunately, the structural arrangements which result in the most desirable electrical characteristics have been largely limited in applicability to manufacturing approaches in which each semiconductive crystal or pellet to be incorporated into a semiconductor device is separately processed and handled.

Because of the extreme cost competitiveness of the semiconductor industry, manufacturing techniques have been developed capable of simultaneously processing semiconductive crystals or pellets for a large number of semiconductor devices while still associated within a single large crystalline disc or wafer. Wafer processing has greatly reduced the unit cost of semiconductive crystals and hence the cost of the semiconductor devices. However, the advantages of mass handling of semiconductive pellets are obtained only by accepting relatively low level electrical performance capabilites and by the necessity of rejecting substantial quantities of completed semiconductor devices due to semiconductive crystal damage produced in fabrication. For example, whereas four layer, three junction thyristor pellets can be individually manufactured capable of reliably providing semiconductor devices capable of blocking terminal applied potentials well in excess of 1000 volts, thyristors having semiconductive crystals formed and processed en masse typically exhibit voltage blocking characteristics well below 400 volts. This is no disadvantage to applications requiring low blocking voltage capabilities, but, obviously, the range of applications for such devices are limited by this parameter. Further, a substantial number of the semiconductor devices produced by such mass handling techniques must be discarded or downgraded as failing to meet even these modest performance criteria due to mechanical damage in processing and assembly.

It is an object of my invention to provide a semiconductor device incorporating a semiconductive crystal having a structure compatible with low cost, multiple pellet handling and fabricating techniques which exhibits improved electrical characteristics and which is less susceptible to in process damage. It is a more specific object of my invention to provide a conveniently manufacturable semiconductor device of improved blocking voltage characteristics.

These and other objects of my invention may be realized in one form by the combination comprised of silicon crystal means having first and second major surfaces lying substantially parallel to the 100 crystallographic axis. The crystal includes a central and a peripheral portion. The central portion has a smooth beveled outer surface sloping from the first major surface toward the peripheral portion. The peripheral portion has a smooth beveled inner surface sloping from the first major surface toward the central portion. The central portion includes at least one rectifying junction lying between the first and second major surfaces and intersecting the smooth beveled outer surface to form a positive bevel angle therewith. A thick glass passivating bonding layer lies adhered to the inner and outer beveled surfaces of the crystal means to join the peripheral and central portions. The glass passivant means exhibits a thermal coefficient of expansion at most equal to that of monocrystalline silicon.

Figure 2:
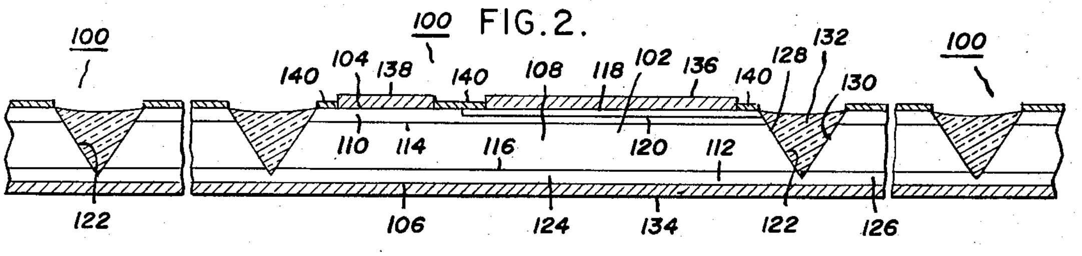
Figure 3:
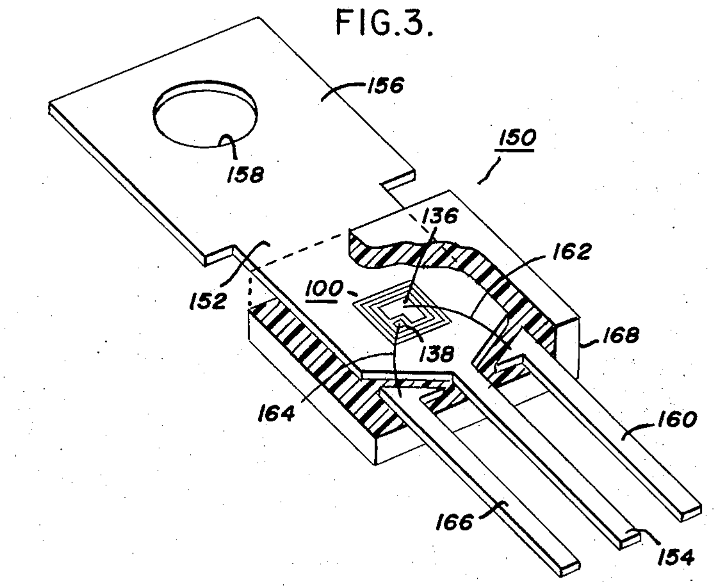
Figure 4:
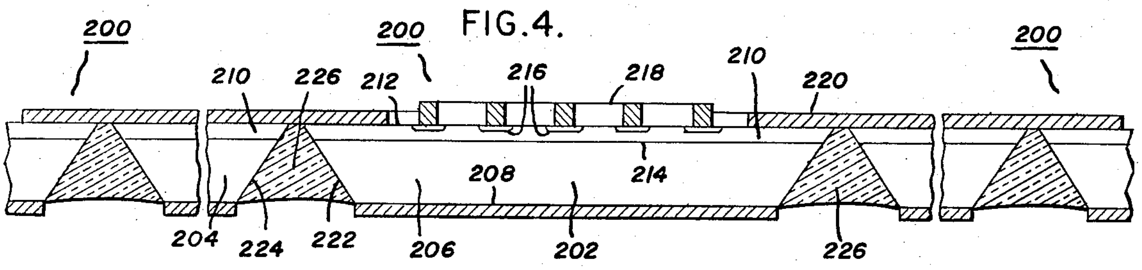

My invention may be better understood by reference to the following detailed description considered in conjunction with the drawings, in which FIG. 1 is a vertical section of conventional semiconductive assemblies as they would appear immediately after separation from a common wafer, FIG. 2 is a vertical section of semiconductive assemblies according to my invention as they would appear immediately after separation from a common wafer, FIG. 3 is an isometric view of a semiconductor device formed according to my invention with a portion shown in section, FIG. 4 is a vertical section of alternate semiconductive assemblies according to my invention as they would appear immediately after separation from a common wafer.

An appreciation of my invention and its distinct advantages can be readily gained by comparison with a conventional structure now in commercial use. In FIG. 1 a plurality of conventional semiconductive assemblies 1 are shown as they would appear immediately after being subdivided from a single large crystalline disc or wafer. Each of the assemblies is formed of a semiconductive pellet or crystal 2 having first and second major surfaces 3 and 5 which are substantially parallel. The crystal is provided with a central zone 7 which is typically of N-type conductivity. A first zone 9 and a second zone 11 of P-type conductivity are interposed between the central zone and the first and second major surfaces, respectively, and form junctions 13 and 15 with the central zone. A third zone 17 is interposed between a portion of the first zone and the first major surface, but spaced from the central zone. Typically the third zone is formed of N+ conductivity. The periphery of each crystal is provided with an upper curved edge 19 that intersects the peripheral edge of the junction 13 and a lower curved edge 21 that intersects the peripheral edge of the junction 15. Thin glass passivant layers 23 and 25 are associated with the upper and lower curved edges to protect the junctions 13 and 15. A metallic contact 27 overlies the lower surface of the semiconductive crystal and the passivant layer 25. The contact is comprised of one or more metal layers that provide an ohmic contact to the second layer 11. A contact 29 is associated with the third layer in ohmically conductive relation. A control contact 31 ohmically engages a portion of the first layer lying along the first major surface. The portion of the upper surface of the semiconductive crystal not covered by glass passivant or contacts is protected by a thin metal oxide layer 33, typically silicon dioxide.

It may be readily seen that the semiconductive assemblies 1 when associated with terminal leads and casings are each suited to form the semiconductively active portion of a semiconductor controlled rectifier. Typically the contact 27 would be associated with an anode lead, the contact 29 with a cathode lead, and the contact 31 with a gate or control lead. As a controlled rectifier the junction 13 must block the forward voltage prior to switching to a conductive made by a proper gate signal, and the junction 15 must withstand peak inverse voltages.

The semiconductive crystals 2 of the assemblies 1 of FIG. 1 are initially joined in a single crystalline wafer. Initially the wafer exhibits the conductivity characteristics of the central zone 7. The junctions 13 and 15 and the zones 9 and 11 are formed by diffusing from the first and second major surfaces. The third zone 17 may be formed by diffusion or by alloying. In order to passify the junctions at the edge of each crystal assembly aligned grooves may be etched from the opposite major surfaces to form the curved edges 19 and 21 that intersect the junctions 13 and 15, respectively. Thin glass passivant layers 23 and 25 are then deposited in the grooves. Since conventional glass passivants exhibit a thermal coefficient of expansion substantially greater than that of silicon crystals, it is conventional practice to limit the thickness of the glass passivant layers to thicknesses of approximately 1 mil or less. The contacts are typically applied after the glass passivant layers are fully formed. Where the contact 27 is applied by vapor plating it may overlie the thin glass layer 25 as shown. It is appreciated that the metal contacts may be of any conventional type and are typically formed of a plurality of different metals and metal layers. The wafer is sub-divided into individual assemblies 1 only after each of the above operations have been fully accomplished. Thus, a very low cost process of fabrication is afforded, since each step may be performed simultaneously on each semiconductive crystal 2 while it is contained in the wafer and, usually, a plurality of wafers may be simultaneously processed.

While the semiconductive assemblies 1 have been shown to meet commercial requirements, they nevertheless exhibit certain disadvantages. First, in forming aligned grooves in a wafer containing the semiconductive crystals, the wafer is held together only by the the thinned crystal portions lying beneath the grooves so that the wafers must be carefully treated in processing to avoid inadvertent breakage along the grooves. The thin glass layers being only a mil or less in thickness do not appreciably increase the strength of the wafer. If an effort is made to increase the glass thickness in the grooves using conventional junction passivant glasses having a thermal coefficient of expansion exceeding that of silicon, the glass will crack and fracture during processing. This, of course, greatly downgrades the passivating effectiveness of the glass layers. Another disadvantage that may occur even with thin glass layers is that the thermal expansion mismatch between the glass and silicon may cause the wafer to become bowed into a non-planar configuration. This creates difficulites in attempting accurate mask alignments in subsequent processing steps and is a source of wafer breakage. An additional disadvantage is that the glass passivant must be placed in the grooves associated with both major surfaces. Many conventional glass application processes are unsuited for the simultaneous application of glass to opposed major surfaces. Accordingly, glass application to the grooves of the opposed major surfaces may be required to be performed sequentially. This is a distinct disadvantage, since glass applications are frequently comprised of several consecutive steps.

The conventional semiconductive assemblies 1 also exhibit certain disadvantages that have a direct bearing on electrical performance as well as ease of manufacture. When the semiconductive assemblies are subdivided along the glassed grooves by scribing and sawing, the glass associated with both the upper and lower grooves must be fractured. Since glass is typically a brittle material, this affords an opportunity to introduce cracks into the glass that will allow contaminants to penetrate to the blocking junctions. An adverse effect on the voltage blocking characteristics of the device follows. Further disadvantages are attributable to the fact that the central zone extends outwardly to the scribed or sawn edge. Thus if the glass layer 25 is fractured or if solder associated with the contact 27 in mounting the assembly to a heat sink or lead inadvertently touches the sawn edge of the crystal, the central zone may be shorted to the anode terminal of the semiconductor device through this path. Even if neither of these possible sources of shorting occur, however, performance may still be compromised. Since the central zone typically has a much lower impurity level than the first and second zones, the space charge region which is associated with a junction in the blocking state will spread farthest from the junction in the central zone. If the depletion layer spreads sufficiently to contact the sawn edge of the central zone, a softening of the breakdown characteristics of the crystal occurs, possibly attributable to surface charge or impurities at the sawn edge. Yet another disadvantage of the semiconductive assemblies 1 is that the portion of each crystal extending beyond the major surfaces are cantilevered when the crystal is mounted into a semiconductor device. Since the semiconductive crystals are typically quite thin, the cantilevered edges are quite fragile and easily damaged in handling and mounting the crystals. A further disadvantage is that the curved edges 19 and 21 form negative bevel angles with the junctions 13 and 15, respectively. As is well understood in the art netgative bevel angles unless controlled within relatively narrow limits tend to predispose crystals toward surface rather than avalanche breakdown when exposed to terminal applied potentials in the blocking state.

In FIG. 2 semiconductive assemblies 100 are shown according to my invention. Each assembly is comprised of a silicon crystal 102 having first and second substantially parallel major surfaces 104 and 106, respectively. The major surfaces are formed to lie in the 100 crystallographic plane of the crystal. The crystal is provided with a central zone 108 which is typically of N type conductivity. A first zone 110 lies between the central zone and the first major surface while a second zone 112 lies between the central zone and the second major surface. The first and central zones form a first junction 114 while the second and central zones form a second junction 116. The first and second zones are of a conductivity type opposite to that of the central zone, typically P type conductivity. A third zone 118 is interposed between a portion of the first zone and the first major surface and forms a junction 120 with the first zone. Where the central zone is of N type conductivity and the first zone is of P type conductivity, the third zone is typically of N+ conductivity type.

The silicon crystal is provided with a circumferential border groove 122 spaced inwardly from its outer edge that divides the crystal into a central portion 124 and a peripheral portion 126. In the form shown the central and peripheral portions are integrally joined by a portion of the second zone. The groove is noted to be formed by a sloped outer surface 128 of the central portion. This surface slopes from the first major surface downwardly and outwardly toward the peripheral portion. An inner surface 130 of the peripheral portion similarly slopes downwardly and inwardly toward the central portion to intercept the sloped surface of the central portion and complete the groove. The sloped surfaces are both smooth and substantially linear to form a V-shaped groove. The groove intersects the first and second junctions. It is to be noted that the sloped outer surface of the central portion intersects the second junction at a positive bevel angle in the range of from 50 to 60°.

A thick glass passivating bonding layer 132 lies in the circumferential border groove. The glass performs the dual functions of passivating the periphery of the junctions within the central portion of the crystal and of bonding the peripheral and central portions of the crystal so as to at least partially offset any weakening of the crystal which may be attributable to the border groove. In order to exhibit appreciable bonding strength the glass must be substantially thicker than the thin glass layers conventionally employed as junction passivants. For example, whereas conventional thin glass passivant layers are typically less than 1 mil in thickness and possess little or no tensile strength, I prefer to employ a thick glass layer that is at least 3 mils in thickness. By bonding to the sloped surfaces of the peripheral and central portions of the crystal with a thick glass layer the crystal exhibits more strength than a comparably grooved silicon crystal having a conventional thin glass passivant layer associated therewith and the weakening effect of grooving can be substantially if not entirely offset.

To allow the glass to be utilized as a thick layer it is important that the glass have a thermal coefficient of expansion which is no greater than that of the silicon. Since silicon is well known to have a remarkably low coefficient of expansion, conventional glass passivants have somewhat larger coefficients of expansion, even where an effort has been made to approximately match the thermal expansion characteristics of the glass to that of the silicon. When glasses are utilized having a thermal coefficient of expansion no greater than that of silicon, I have observed that fracturing of thick glass layers is obviated upon thermal cycling of the semiconductive assemblies within the temperature ranges normally encountered in use.

In order to achieve the desired junction passivating qualities it is desirable that the thick glass layer exhibit an insulative resistance of at least $10^{12}$ ohm-cm, so as to avoid shunting any significant leakage current around the junction to be passivated. To withstand the high field strengths likely to be developed across the junction during reverse bias, as is particularly characteristic of rectifiers, the glass layer is chosen to exhibit a dielectric strength of at least 600 volts/mil and preferably at least 1,000 volts/mil for high voltage rectifier uses. When the central portion of the semiconductive crystal is exteriorly beveled according to my teaching and provided with a glass passivation layer, the semiconductive element is capable of withstanding reverse biasing at exceptionally high potential levels without being destroyed by surface breakdown. It is to be noted that by using a thick glass layer rather than the conventional thin glass layer a somewhat lower dielectric strength for the glass can be used to obtain comparable performance, since surface effects contributing to breakdown play a less significant role with thick glass layers than with thin glass layers. I have further observed that it is desirable to minimize the alkali content of the glass layer in order to avoid migration of alkali ions in the glass to the silicon surface and thereby predispose the silicon crystal to surface breakdown rather than bulk breakdown. Accordingly, I prefer to utilize an essentially alkali free glass to form the glass bonding layer, although minor amounts up to about 10 per cent by weight of alkaline earth and earth metal oxides may be incorporated in the glass without appreciable adverse effect. Borosilicate glasses are well known to exhibit extremely low thermal coefficients of expansion and are generally preferred. I have discovered that alkali free lead borosilicate glasses are excellently suited to the practice of my invention. I prefer to utilize essentially alkali free lead borosilicate glasses comprised of, on a weight basis, from 60 to 80 per cent silicon dioxide, from 15 to 30 per cent boron oxide, and from 5 to 15 per cent lead oxide. Specific examples of suitable glasses for the practice of my invention include lead borosilicate glasses consisting essentially of, on a weight basis (1) 73 per cent silicon dioxide, 16.5 per cent boron oxide, and 10.5 per cent lead oxide and (2) 76.5 per cent silicon dioxide, 17.3 per cent boron oxide, and 6.3 lead oxide. Other suitable lead borosilicate glasses are commercially available.

The semiconductive assembly 100 includes an ohmic contact layer 134 overlying the entire second major surface of the crystal in low impedance electrically conductive relation with the second zone 124. A contact layer 136 overlies the third zone 118 while a contact layer 138 overlies a portion of the first zone 110 lying adjacent the first major surface 104. The contact layers may each be formed of single or multiple layers of one or more metals and may be of any conventional construction. An oxide or nitride layer 140 covers the portions of the first major surface not covered by the contact layers.

The semiconductive crystals 102 of the assemblies 100 of FIG. 2 may be conveniently processed while intergrally joined in a single crystalline wafer. Initially the wafer may exhibit the conductivity characteristics of the central zone 108. The junctions 114 and 116 may be formed by diffusing from the first and second major surfaces. The third zone 118 may be formed by diffusion or by alloying. In order to passivate the periphery of the blocking junctions 114 and 116 associated with the central portion of each crystal, a plurality of spaced grooves 122 are etched into the wafer from the first major surface 104. By forming the wafer so that the first major surface lies along the 100 crystallographic axis, the groove may be formed in the desired V shape with the sloped sides 128 and 130 forming a positive bevel angle with respect to the junction 116 in the range of from 50° to 60°. As is understood in the art, the grooves may be formed in 100 silicon with the desired bevel angle by using an alcoholic potassium hydroxide solution as an etchant. This technique offers the distinct advantage that the depth of the groove may be very accurately controlled merely by controlling the width of the grooves. For example, typically a wafer would be covered over its entire first major surface with a masking layer resistant to etchant, such as a silicon dioxide or silicon nitride layer. Then the masking layer may be selectively removed to define the portion of the first major surface to be subtended by the grooves. Then merely by contacting the first major surface with the alcoholic potassium hydroxide solution the grooves may be automatically formed to the desired depth and bevel configuration. Typically the bevel angle is approximately 55°, but may be varied somewhat if, for example, the first major surface departs slightly from the 100 crystallographic axis. Producing the grooves by this etch technique also offers a distinct advantage in that the sloped sides of the groove are considerably smoother by this etching technique than if the grooves were formed by mechanical beveling. This offers the unexpected advantage that the voltage blocking capabilities of the crystal are considerably better than would be predicted merely on the basis of the bevel angle. The reason for this is that the etchant produces less surface damage to the crystal than mechanical beveling. Hence fewer surface bonds are available to contribute to surface breakdown of the crystal. Formation of the contact layers may be achieved by any conventional technique. The glass may be formed in the grooves by selectively depositing into the grooves an aqueous slurry of finely divided glass frit, drying the slurry to leave the frit, and sintering to fuse the glass into a unitary nonporous body.

In FIG. 3 a semiconductor device 150 incorporates a semiconductive assembly 100 mounted on an electrically and thermally conductive heat sink 152. The contact layer 134 which covers the second major surface of the semiconductive crystal is united in intimate thermally and electrically conductive relation to the heat sink. The heat sink is provided along one edge with an integrally formed terminal lead 154. Along a spaced edge the heat sink is provided with a tab 156 having an aperture 158 to facilitate mounting of the semiconductor device and heat removal from the heat sink. The contact layer 136 overlying the third zone of the semiconductive crystal is connected to a terminal pin 160 by a fly wire 162. A second fly wire 164 connects the contact layer 138 associated with the first zone with a terminal pin 166. A plastic housing 168 sectioned horizontally in the same plane as the lower surface of the heat sink is shown (partially indicated in dashed outline) enveloping the heat sink and the inner extremities of the terminal leads. The plastic housing is preferably formed of a synthetic resin having high dielectric properties, such as silicone, phenolic, eopxy or polyester resins. The plastic not only protects the semiconductive assembly but also serves to mount the terminal leads 160 and 166 in the desired orientation with respect to the heat sink. It is, of course, appreciated that use of a thick glass layer requires less protection by the plastic than conventional thin glass layers. Further, it is anticipated that devices may be formed according to my invention which entirely omit any plastic encapsulant.

The semiconductor device shown in FIG. 3 not only exhibits outstanding electrical characteristics, but is also of a construction rendering it conveniently manufacturable. Comparing the semiconductive assembly 100 with the semiconductive assembly 1, a number of distinct advantages are in evidence. First, it is to be noted that the assemblies 1 in wafer form are joined only by a thinned crystal portion lying beneath the grooves. By contrast in processing the semiconductive assemblies 100 the peripheral portions 126 join adjacent assemblies. The peripheral portions are not thinned by etching and hence the peripheral portions form a rib network surrounding the central portions 124 of the assemblies which contribute to a much stronger wafer structure. Thus, the wafers from which the assemblies 100 are formed are much more rigid and less susceptible to breakage or warping than the wafers from which the assemblies 1 are formed.

The semiconductive assembly 100 is superior to the assembly 1 also in that the glass passivant layer is more reliably protected against damage. Whereas to form the assembly 1 two glass layers must be sawn or scribed around the entire periphery of the semiconductive crystal, thereby providing a relatively high probability of damage, in separating the assemblies 100 from a wafer the scribing or sawing is confined to the peripheral portions and entirely avoids contact with the thick glass passivant layer. Accordingly a low likelihood of damage of the glass passivant layer exists. Still further, it is to be noted that the passivant layer is spaced inwardly from the edge of the crystal 102 so that the possibility of damage by mechanical shocks in handling is minimized. This is in direct contrast to the assembly 1 in which two glass layers are located at the edge and are supported by a fragile cantilevered edge portion of the crystal. Having a thick glass layer bonding the central and peripheral portions of the crystal 102, also adds considerably to the strength of the crystal. Another advantage of the assembly 100 is that the glass layer need only be applied from one major surface rather than two as in the case of the assembly 1.

In addition to mechanical and fabrication advantages the assembly 100 also possesses distinct electrical advantages over the assembly 1. In the crystal 102 the central portion of the central zone, which is the current carrying portion of the central zone, is protected from direct exposure whereas in the crystal 2 the central zone is exposed. Since the central zone of each crystal is of highest resistivity, the depletion layer spreads farthest in this zone. In the crystal 2 the depletion layer can spread to the exposed edge of the central zone, but in the crystal 102 this is not possible, there being no exposed edge. In the crystal 2 when the depletion layer approaches the sawn or scribed edge of the central edge a softening of the blocking characteristics of the crystal may be observed, but with crystal 102 no softening of blocking characteristics attributable to this source is observed. Additionally, it is to be noted that if some metallization is inadvertently brought into contact with the sawn or scribed edge of the crystal 102, this cannot have the effect of short circuiting the electrically active portion of the junction 116 associated with the central portion, since the portion of the central zone lying in the peripheral portion is electrically isolated by the groove and glass layer from the central portion of the central zone. It can be seen that the peripheral portion of the crystal 102 supplements the glass layer in avoiding short circuiting of the junctions by inadvertent edge metallization in assembly and mount down.

A further advantage of the semiconductive assembly 100 is that the junction 116 is traversed by the smooth outer surface of the central portion at a positive bevel angle. This is in direct contrast to the assembly 1 in which the junction 15 is negatively beveled. The exceptional smoothness of the outer edge of the central portion supplements the beveling in improving the voltage blocking capability of the junction 116. The structural arrangement which preserves and insures the integrity of the thick glass layer 132 also adds to the blocking capabilities of the assembly 100.

The remainder of the semiconductor device shown in FIG. 3 is also susceptible to low cost manufacturing techniques. Initially the heat sink 152 and the terminal leads 160 and 166 may be integrally associated in a metal plate having many similar heat sinks and terminal leads laterally spaced. Mounting of the semiconductive assemblies 100 on the heat sinks may be accomplished very rapidly, since only approximate location is required. After the fly wires are attached, the housing 168 for each of the semiconductor devices to be formed from a single metal plate may be simultaneously formed. Thereafter the heat sink and terminal leads are lanced free of the remainder of the metal plate to form the completed device.

While I have described my invention with specific reference to a semiconductor controlled rectifier, it is appreciated that it may be applied to differing forms of semiconductor devices. For example, a thyristor switched by avalanche effects rather than a gate signal may be formed merely by omitting the contact layer 138 from the semiconductive assembly 100. It is also apparent that my invention is readily applicable to rectifiers generally, including triacs (or bilateral thyristors) and PN, P+PN, PIN, and PNN+ diodes.

To further illustrate my invention, in FIG. 4 semiconductive assemblies 200 are illustrated. The silicon crystal portion of the device is noted to be divided into a central portion 202 and a concentrically located peripheral portion 204. Extending through both crystal portions are a collector zone 206 lying adjacent a first major surface 208 and a base zone 210 lying adjacent a second major surface 212. The base zone is usually quite thin as compared to the collector zone and may range from only a few microns in thickness to 20 microns for very high voltage devices. The base and collector zones form a collector junction 214 therebetween. A very shallow interdigitated emitter layer 216 is located adjacent the second major surface of the central portion. The depth of the emitter layer may be only one or two microns or less. The emitter layer forms an emitter junction with the base zone. An ohmic emitter contact layer 218 overlies the major portion of the emitter zone adjacent the second major surface. The emitter contact layer provides a low impedance electrical connection to the emitter zone. Surrounding and spaced from the emitter contact layer is a base contact layer 220 ohmically associated with the base zone at the second major surface.

It is to be noted that the central portion is provided with a smooth outer beveled edge 222 that slopes upwardly and outwardly toward the peripheral portion. Similarly the peripheral portion is provided with a smooth sloped beveled edge 224 sloping upwardly and inwardly toward the central portion. A thick glass passivating bonding layer 226 is adhered to both sloped surfaces and, together with the base contact layer 220, holds the peripheral and central portions together as a unitary structure.

The semiconductive assemblies 200 are preferably formed simultaneously from a unitary large diameter crystalline wafer in a manner generally analogous to that described above in connection with assemblies 100. After the junctions have been formed in the crystal by conventional techniques, the base and emitter contact layers may be simultaneously laid down on the second major surface as a unitary metal layer. Selective etching at any convenient point in the manufacturing process may be utilized to divide the base and emitter contact layers into separate elements and to provide the required spacing therebetween. The formation of the sloped surfaces 222 and 224 is preferably accomplished by etching with an alcoholic potassium hydroxide solution in the same general manner as in the formation of the grooves 122. In forming the assemblies 200, however, the collector junction of the transistor structure lies so close to the second major surface of the crystal that little if any crystal strength would be gained by attempting to regulate the depth of a groove so that it traversed the collector junction but stopped short of the second major surface. Accordingly, the etching width on the first major surface is chosen to allow etching entirely through the crystal thickness. Etching entirely through the silicon does not affect the bevel angle of the sloped sides, which remains at approximately 55 degrees as discussed above. In order to preserve the original relationship of the central and peripheral portions subsequent to etching the base contact layer is preferably laid down before etching. Instead of or to supplement the base contact layer the wafer may be temporarily mounted on a supporting substrate, if desired. The formation of the thick glass layer 226 may be identical to the formation of the thick glass layer 132. The semiconductive assemblies are divided from the wafer by scribing or sawing through the peripheral portions.

The advantages of the semiconductive assemblies 200 are generally similar to those of the assemblies 100. It is to be noted that the collector junction 214, which is the principal voltage blocking junction in a transistor, intersects the glass passivated, smooth beveled edge 222 of the central, electrically active portion of the silicon crystal. The collector junction is typically positively beveled, since typically the base zone is diffused into a wafer having the conductivity characteristics of the collector zone.

It is appreciated that instead of etching entirely through the silicon wafer to form the central and peripheral portions of the assemblies 200 the central and peripheral portions could be left in integral interconnection to form a groove therebetween. Also, in the assemblies 100 instead of providing grooves 122 the crystal could as well be completely etched through to separate the central and peripheral portions. In still another variation, not shown, a groove could be provided of trapezoidal configuration, since the etchant initially forms a trapezoidal groove and gradually shapes a center trough or apex in the crystal by interaction with the crystallographic planes. Thus, a trapezoidal groove may be formed by removing the etchant at any point prior to depletion of the silicon lying in the proper crystallographic orientation for etching.

What I claim and desire to secure by Letters Patent of the United States is:

1. The combination comprising a silicon sheet including a plurality of side-by-side wafer-like silicon crystal means each having first and second major surfaces lying substantially parallel to the (100) crystallographic plane, each said crystal means including a central portion and a surrounding laterally extending peripheral portion, each said central portion having a smooth beveled outer surface sloping from said first major surface toward its surrounding peripheral portion, each said peripheral portion having a smooth beveled inner surface sloping from said first major surface toward the central portion surrounded thereby, each respective set of beveled outer and inner surfaces defining an annular groove opening to said first major surface between respective central and peripheral portions, each said central portion including at least one rectifying junction lying between said first and second major surfaces and intersecting the adjacent smooth beveled outer surface to form a positive bevel angle in the range of from 50° to 60° therewith, and a layer of essentially alkali-free passivating and bonding glass havnng a thickness of at least about 3 mils lying adhered to said inner and outer beveled surfaces of each of said crystal means to join each said peripheral with its surrounded central portion, said glass passivant layer having a thermal coefficient of expansion at most equal to that of monocrystalline silicon.

2. The combination according to claim 1 in which the second major surface of each said crystal means is comprised of a metal contact layer overlying both the peripheral and central portions of said crystal means.

3. The combination according to claim 1 in which said thick glass passivating bonding layer is formed of an essentially alkali-free lead borosilicate glass comprised of, on a weight basis, from 60 to 80 per cent silicon dioxide, from 15 to 30 per cent boron oxide, and from 5 to 15 per cent lead oxide.

* * * * *